United States Patent
Chen

(10) Patent No.: US 8,368,442 B1
(45) Date of Patent: Feb. 5, 2013

(54) CHARGE PUMP

(75) Inventor: Chien-Liang Chen, Taoyuan (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 13/209,502

(22) Filed: Aug. 15, 2011

(51) Int. Cl.
*H03L 7/06* (2006.01)

(52) U.S. Cl. .................................. 327/157; 327/148

(58) Field of Classification Search ............... 327/148, 327/157
See application file for complete search history.

(56) References Cited

U.S. PATENT DOCUMENTS

| | | | |
|---|---|---|---|
| 5,508,660 A * | 4/1996 | Gersbach et al. ............ 331/17 |
| 6,124,741 A | 9/2000 | Arcus | |
| 6,781,425 B2 * | 8/2004 | Si ................................. 327/148 |
| 7,061,290 B2 * | 6/2006 | Hasegawa .................... 327/157 |
| 7,075,348 B2 * | 7/2006 | Hsu et al. ..................... 327/157 |
| 7,365,593 B1 * | 4/2008 | Swanson ...................... 327/536 |
| 7,382,849 B1 * | 6/2008 | Groe et al. .................... 375/374 |
| 7,439,784 B2 * | 10/2008 | Lin ................................ 327/157 |
| 7,557,625 B1 | 7/2009 | Bazes | |
| 7,692,461 B2 * | 4/2010 | Haerle ......................... 327/157 |
| 7,834,707 B2 * | 11/2010 | Chien ............................ 331/17 |
| 8,222,937 B2 * | 7/2012 | Haerle ......................... 327/157 |
| 8,232,822 B2 * | 7/2012 | Tsai .............................. 327/157 |
| 2004/0124936 A1 * | 7/2004 | Li ................................. 331/160 |
| 2005/0162202 A1 * | 7/2005 | Suzuki .......................... 327/157 |
| 2007/0188205 A1 * | 8/2007 | Chen ............................ 327/157 |
| 2009/0289674 A1 * | 11/2009 | Kao et al. ..................... 327/157 |
| 2010/0073051 A1 * | 3/2010 | Rao et al. ..................... 327/157 |
| 2011/0199136 A1 * | 8/2011 | Tsai .............................. 327/157 |

* cited by examiner

*Primary Examiner* — Adam Houston
(74) *Attorney, Agent, or Firm* — Ding Yu Tan

(57) ABSTRACT

A charge pump exhibiting a voltage compensation function is provided. The charge pump includes: a first current generator, a first semiconductor device, a second current generator, a second semiconductor device, and a voltage regulator. The voltage regulator dynamically adjusts a voltage level at the gate of the first or second semiconductor device so as to adjust a first current or a second current outputted to a current output node. In addition, the voltage regulator provides a bias voltage at the current output node when both the first and second semiconductor devices are turned off.

17 Claims, 5 Drawing Sheets

US 8,368,442 B1

CHARGE PUMP

FIELD OF THE INVENTION

The present invention relates to a charge pump, and more particularly to a charge pump exhibiting a voltage compensation function.

BACKGROUND OF THE INVENTION

FIG. 1A is a schematic functional block diagram illustrating a conventional phase locked loop. The phase locked loop (PLL) 10 includes a phase/frequency detector (PFD) 101, a charge pump (CP) 103, a low pass filter (LPF) 105 and a voltage control oscillator (VCO) 107. The phase locked loop 10 is optionally comprised of a frequency divider 109. The operating principle of the phase locked loop 10 will be illustrated as follows. Firstly, a divided signal $V_{div}$ from the frequency divider 109 and an input signal $V_{in}$ are received by the phase/frequency detector 101. Then, a phase difference between the divided signal $V_{div}$ and the input signal $V_{in}$ is detected. According to the phase difference, the frequency of an output signal $V_{out}$ from the voltage control oscillator 107 is adjusted. The frequency of the output signal $V_{out}$ is divided by the frequency divider 109, and the divided signal $V_{div}$ is issued to the phase detector 101. Ideally, the frequency of the divided signal $V_{div}$ is identical to that of the input signal $V_{in}$.

FIG. 1B is a schematic diagram illustrating the interconnection among the phase/frequency detector, the charge pump, and the low pass filter. After the phase/frequency detector 101 receives the input signal $V_{in}$ and the divided signal $V_{div}$, the phase/frequency detector 101 outputs comparing signals ($V_{up}$, $V_{down}$). The comparing signals ($V_{up}$, $V_{down}$) are used for respectively controlling the switching states of the semiconductor devices (P1, N1) in the charge pump 103. Consequently, the low pass filter 105 is charged or discharged in response to the switching states of the semiconductor devices (P1, N1).

Charging/discharging the low pass filter 105 results in changes of the voltage level $V_{CP}$ at the current output node $S_{CP}$, and further affects the frequency of the output signal $V_{out}$ generated and outputted from the voltage control oscillator 107.

The operations of the phase/frequency detector 101, charge pump 103, low pass filter 105, and voltage control oscillator 107 will be further discussed below.

In a case that the frequency of the input signal $V_{in}$ is greater than frequency of the divided signal $V_{div}$, the charge pump 103 charges the low pass filter 105 according to the first comparing signal $V_{up}$. After being charged, the voltage level $V_{CP}$ at the current output node $S_{CP}$ is increased, and so are the frequencies of the output signal $V_{out}$ and the divided signal $V_{div}$.

Therefore, the increase of the voltage level $V_{CP}$ at the current output node $S_{CP}$ indirectly causes the increase of the frequency of the divided signal $V_{div}$. In spite the frequency of the divided signal $V_{div}$ less than the frequency of the input signal $V_{in}$ at the first, the frequencies of the output signal $V_{out}$ and the divided signal, $V_{div}$ become higher as the low pass filter 105 is charged. As a result, by increasing the voltage level $V_{CP}$ at the current output node $S_{CP}$, the frequency of the divided signal $V_{div}$ increases so as to approach the frequency of the input signal $V_{in}$.

In a case that the frequency of the input signal $V_{in}$ is less than that of the divided signal $V_{div}$, the charge pump 103 discharges the low pass filter 105 according to the second comparing signal $V_{down}$ generated from the phase/frequency detector. After discharging, the voltage level $V_{CP}$ at the current output node $S_{CP}$ is decreased, and so are the frequencies of the output signal $V_{out}$ and the divided signal $V_{div}$.

Therefore, the decrease of the voltage level $V_{CP}$ at the current output node $S_{CP}$ indirectly causes the decrease of the frequency of the divided signal $V_{div}$. In spite the frequency of the divided signal $V_{div}$ is greater than the frequency of the input signal $V_{in}$ at the first, the frequencies of the output signal $V_{out}$ and the divided signal $V_{div}$ become less as the low pass filter 105 is discharged. As a result, by decreasing the voltage level $V_{CP}$ at the current output node $S_{CP}$, the frequency of the divided signal $V_{div}$ decreases so as to approach the frequency of the input signal $V_{in}$.

In brief, since the voltage level $V_{CP}$ at the current output node $S_{CP}$ correlates to the frequencies of the output signal $V_{out}$ and divided signal $V_{div}$, the control of the voltage level $V_{CP}$ at the current output node $S_{CP}$ facilitates the stabilization of the phase locked loop 10. It is shown that the control of the voltage level $V_{CP}$ is an important issue.

In details, with reference to FIG. 1B, an inverted first comparing signal $V_{up}'$ is generated by inverting the first comparing signal $V_{up}$ by an inverter 102a and received by the charge pump 103.

According to the inverted first comparing signal $V_{up}'$, the switching state of the first p-channel metal-oxide-semiconductor (PMOS) P1 is determined. In a case that the logic state of the first comparing signal $V_{up}$ is logic "1", then the logic state of the inverted first comparing signal $V_{up}'$ is logic "0", and the first PMOS P1 is turned on. In such a case, the low pass filter 105 is charged by the charge pump 103 and the voltage level $V_{CP}$ at the current output node $S_{CP}$ is increased accordingly.

On the other hand, the second comparing signal $V_{down}$ is propagated via a transmission gate 102b. The propagated second comparing signal $V_{down}^{\Delta}$ is received by the charge pump 103.

With the propagated second comparing signal $V_{down}^{\Delta}$, the switching state of the first n-channel metal-oxide-semiconductor (NMOS) N1 is determined. In a case that the logic state of the propagated second comparing signal $V_{down}^{\Delta}$ is logic "1", the first NMOS N1 is turned on. In such a case, the low pass filter 105 is discharged by the charge pump 103 and the voltage level $V_{CP}$ at the current output node $S_{CP}$ is decreased accordingly.

From the above discussions, in a case that logic states of the first and second comparing signals $V_{up}$, $V_{down}$ are logic "0", the first PMOS P1 and the first NMOS N1 are both turned off. In such a case, the voltage level $V_{CP}$ at the current output node $S_{CP}$ becomes floating.

If the voltage control oscillator 107 receives the floating voltage level $V_{CP}$ at the current output node $S_{CP}$, jitters are easily generated as noises might be occurred. Therefore, how to stabilize the voltage level $V_{CP}$ when both the comparing signals $V_{up}$, $V_{down}$ are high impedance is an important issue.

Ideally, the influences of the charging operation of the first and second PMOS, and the discharging operation of the first and second NMOS on the low pass filter 105 can be balanced. However, these two types of transistors are not completely symmetrical to each other in practice, and the intensities of the charging current and the discharging current are hard to completely equal to each other.

SUMMARY OF THE INVENTION

Therefore, an aspect of the present invention provides a charge pump capable of providing a bias voltage at the current output node.

Besides, another aspect of the present invention provides a charge pump capable of balancing the charging current from the PMOS and the discharging current from the NMOS whenever the voltage level $V_{CP}$ at the current output section $S_{CP}$ changes.

In accordance with an aspect, the present invention provides a charge pump, comprising: a first current generator electrically connected to a first voltage terminal, and providing a first current; a first semiconductor device electrically connected to the first current generator and a current output node, and optionally turned on to conduct flow of the first current to the current output node; a second current generator electrically connected to a second voltage terminal and providing a second current; a second semiconductor device electrically connected to the second current generator and the current output node, and optionally turned on to conduct flow of the second current to the current output node; and a voltage regulator electrically connected to the first and second semiconductor devices and the current output node for dynamically adjusting a voltage level at the gate of the first or second semiconductor device so as to adjust the first current or the second current outputted to the current output node.

In accordance with another aspect, the present invention provides a charge pump, comprising: a first current generator for providing a first current to a current output node; a first semiconductor device electrically connected to the first current generator and the current output node, and turned on in response to a specified state of a first signal inputted thereto so as to conduct flow of the first current to the current output node; a second current generator for providing a second current; a second semiconductor device electrically connected to the second current generator and the current output node, and turned on in response to a specified state of a second signal inputted thereto so as to conduct flow of the second current to the current output node; and a voltage regulator electrically connected to the first and second semiconductor device and the current output node, and configured to provide a bias voltage at the current output node.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

For solving the incompatible current and jitter problem encountered by prior art, a charge pump according to an embodiment of the present invention, provides a small current between the voltage terminals $V_{dd}$ and $V_{GND}$ so as to provide a bias voltage to the current output node $S_{CP}$ for voltage compensation.

Figure 1A:
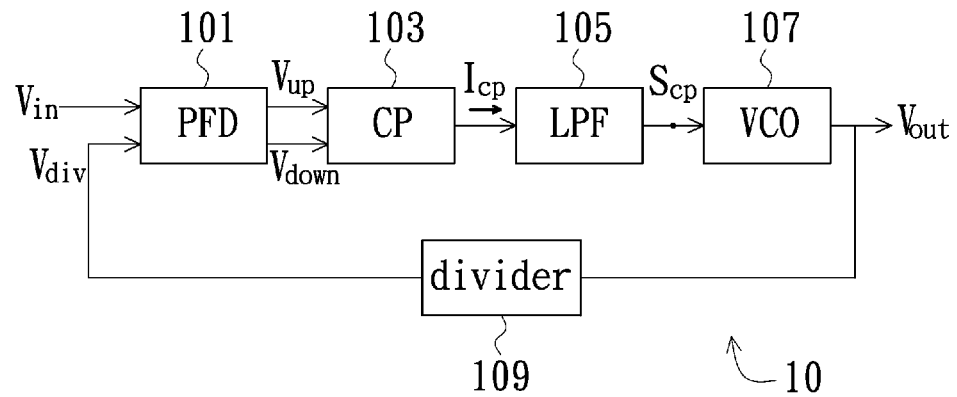
FIG. 1A is a schematic functional block diagram illustrating a conventional phase locked loop.
Figure 1B:
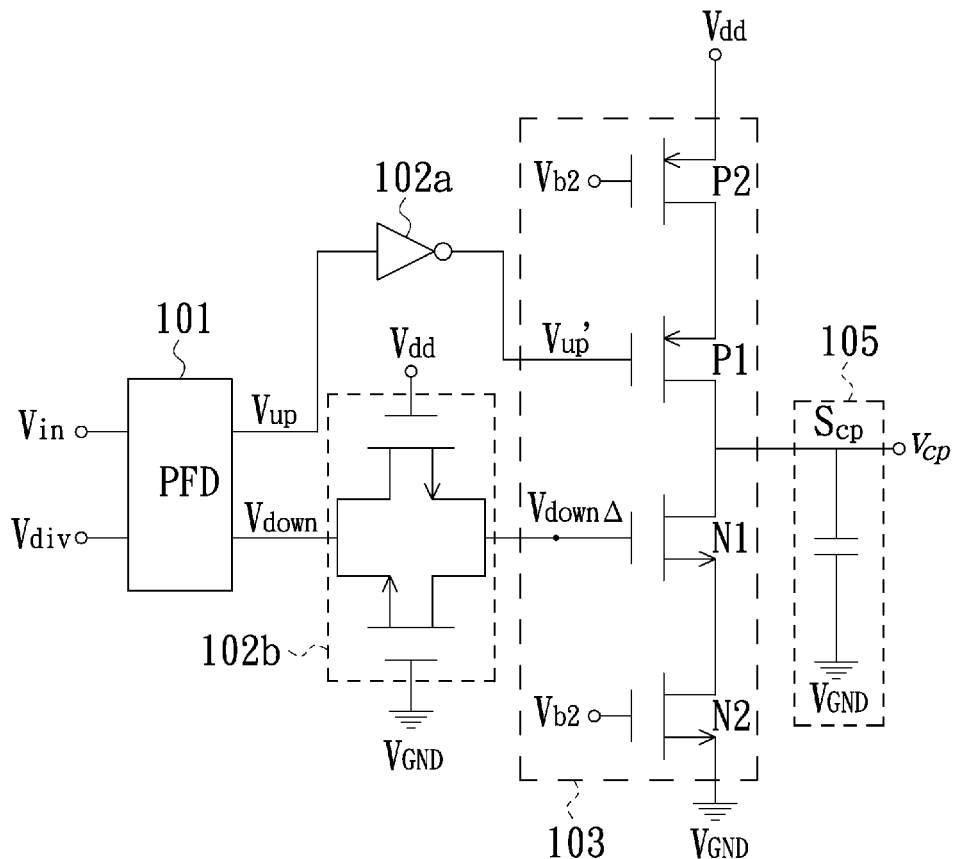
FIG. 1B is a schematic diagram illustrating the interconnection among the phase/frequency detector, the charge pump, and the low pass filter.
Figure 2:
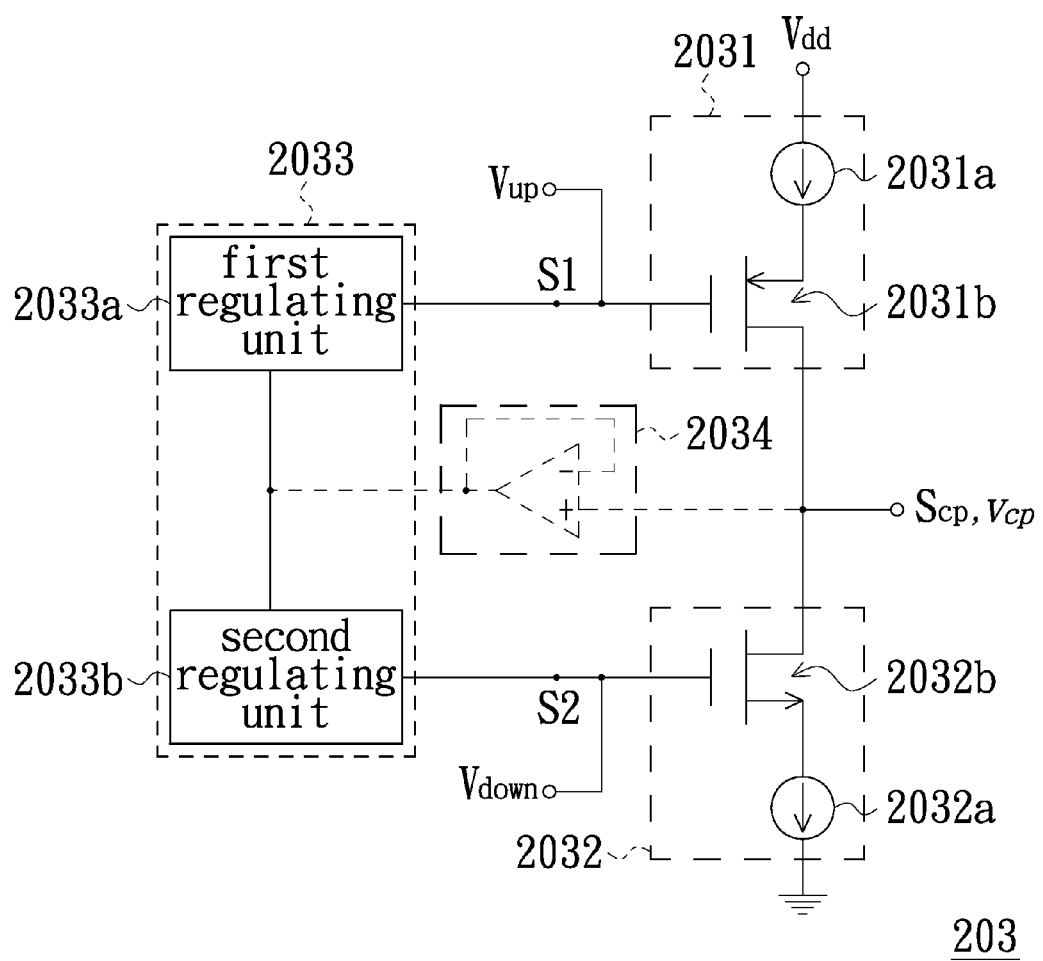
FIG. 2 is a schematic diagram illustrating the internal connections of a charge pump according to an embodiment of the present invention.

FIG. 2 is a schematic diagram illustrating the internal connections of a charge pump according to an embodiment of the present invention. In the charge pump 203, a certain intensity of current is provided at the current output node $S_{CP}$ according to a set of comparing signals ($V_{up}$, $V_{down}$) or a set of biasing voltage generated by a voltage regulator 2033 when the set of comparing signals ($V_{up}$, $V_{down}$) are high impedance. The charge pump 203 includes a constant current source (CCSO) 2031, a constant current sink (CCSI) 2032, and the voltage regulator 2033. The CCSO 2031 includes a first current generator 2031a, and a first semiconductor device 2031b. The CCSI 2032 includes a second current generator 2032a, and a second semiconductor device 2032b. The set of comparing signals ($V_{up}$, $V_{down}$) are tri-state signals whose states are high voltage level, low voltage level or high impedance.

Figure 3A:
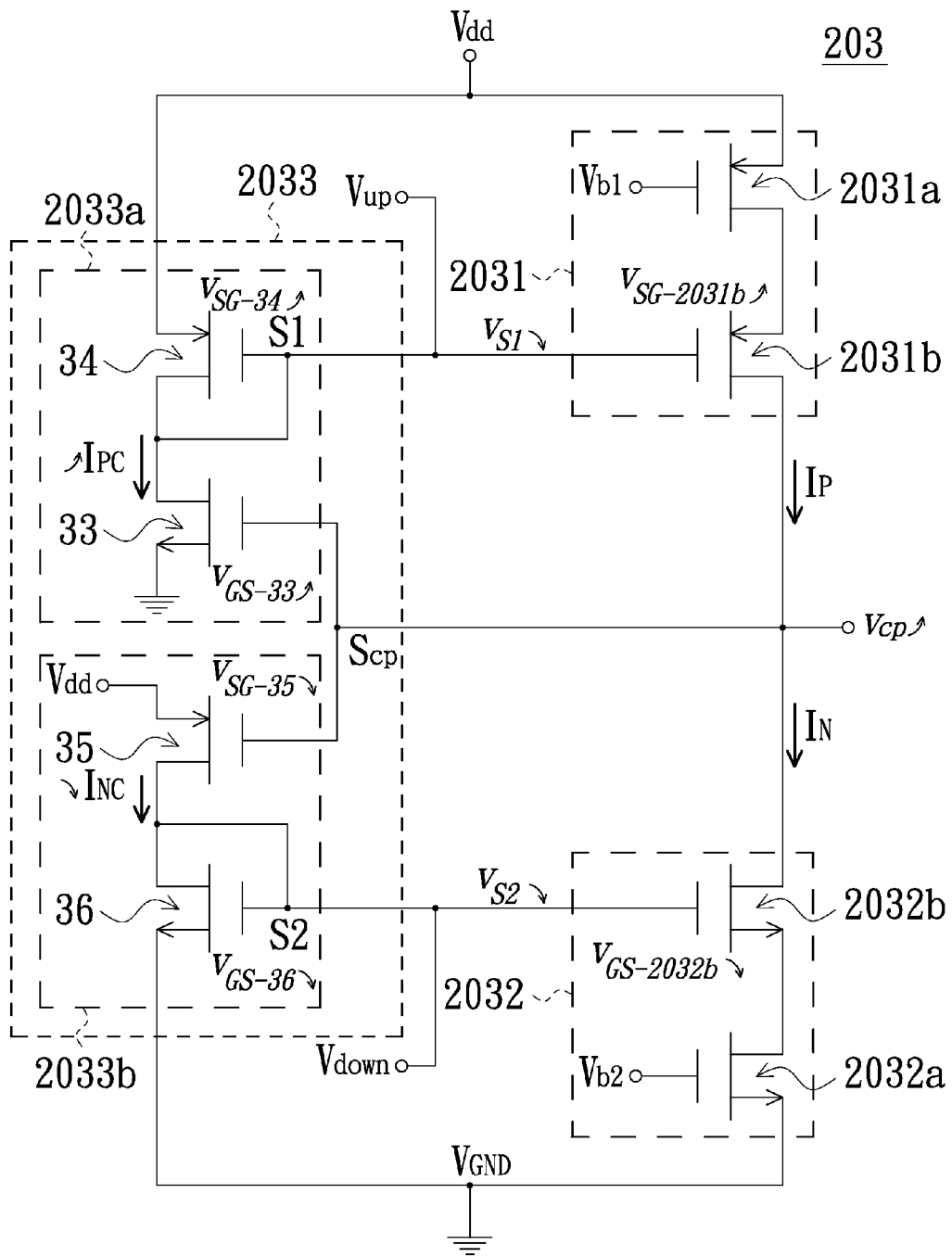
FIG. 3A is a schematic circuit diagram illustrating operations of an example of the charge pump as shown in FIG. 2 when the voltage level at the current output node increases.

Please refer to FIG. 3A, which illustrates an example of the charge pump as shown in FIG. 2. The first current generator 2031a is electrically connected to a first voltage terminal $V_{dd}$ and the current output node $S_{CP}$. Based on a first bias control voltage $V_{b1}$, the first current generator 2031a provides a first current $I_P$. On the other hand, the second current generator 2032a is electrically connected to the second voltage terminal $V_{GND}$. Based on a second bias control voltage $V_{b2}$, the second current generator 2032a provides a second current $I_N$.

The source and drain of the first semiconductor device 2031b are electrically connected to the first current generator 2031a and the current output node $S_{CP}$, respectively. The first semiconductor device 2031b is turned on according to the first comparing signal $V_{up}$. If the first semiconductor device 2031b is turned on, the first current $I_P$ is provided to the current output node $S_{CP}$. The first current $I_P$ serves as a charging current for charging a downstream low pass filter (not shown). When the first comparing signal $V_{up}$ is high impedance, the first semiconductor device 2031b is biased according to a voltage level $V_{S1}$.

The source and gate of the second semiconductor device 2032b are electrically connected to the second current generator 2032a and the current output node $S_{CP}$, respectively. The second semiconductor device 2032b is turned on according to the second comparing signal $V_{down}$. If the second semiconductor device 2032b is turned on, the second current $I_N$ is provided to the current output node $S_{CP}$. The second current $I_N$ serves as a discharging current for discharging a downstream low pass filter (not shown). When the second comparing signal $V_{down}$ is high impedance, the second semiconductor device 2032b is biased according to a voltage level $V_{S2}$.

As for the voltage regulator 203, it is electrically connected to the gates of the first and second semiconductor device 2031b, 2032b and the current output node $S_{CP}$.

In a case that the set of comparing signals ($V_{up}$, $V_{down}$) are high impedance, the voltage regulator 2033 provides a first bias voltage and a second bias voltage to the gates of the first and second semiconductor device 2031b, 2032b, respectively.

In a case that the set of comparing signals ($V_{up}$, $V_{down}$) are high impedance, the voltage regulator 2033 dynamically adjusts the first or second bias voltage in response to changes of the voltage level $V_{CP}$ at the current output node $S_{CP}$. By dynamically adjusting voltage levels at the first and second bias node S1, S2, the first current $I_P$ and the second current $I_N$ can be timely stabilized.

According to the present invention, the voltage regulator 2033 includes a first regulating unit 2033a and a second regulating unit 2033b. The first regulating unit 2033a is electrically connected between the first voltage terminal $V_{dd}$ and the current output node $S_{CP}$, and includes a third semiconductor device 33 and a fourth semiconductor device 34. The second regulating unit 2033b is electrically connected between the second voltage terminal $V_{GND}$ and the current output node $S_{CP}$, and includes a fifth semiconductor device 35 and a sixth semiconductor device 36.

The first regulating unit 2033a is used together with the first current generator 2031a and the first semiconductor device 2031b to stabilize the first current $I_P$ provided by the first current generator 2031a by providing the first bias voltage to the gate of the first semiconductor device 2031b.

The second regulating unit 2033b is used together with the second current generator 2032a and the second semiconductor device 2032b to stabilize the second current $I_N$ provided by the second current generator 2032a by providing the second bias voltage to the gate of the second semiconductor device 2032b.

The first regulating unit 2033a is electrically connected to the first voltage terminal $V_{dd}$, the second voltage terminal $V_{GND}$, and the current output node $S_{CP}$. The first regulating unit 2033a and the first semiconductor device 2031b are both electrically connected to the first bias node S1. The first regulating unit 2033a generates and outputs a first compensated current $I_{PC}$ to the current output node $S_{CP}$ by means of the voltage level $V_{S1}$ on the first bias node S1 when the set of comparing signals ($V_{up}$, $V_{down}$) are high impedance.

The second regulating unit 2033b is electrically connected to the first voltage terminal $V_{dd}$, the second voltage terminal $V_{GND}$, and the current output node $S_{CP}$. The second regulating unit 2033b and the second semiconductor device 2032b are both electrically connected to the second bias node S2. The second regulating unit 2033b generates and outputs a second compensated current $I_{NC}$ to the current output node $S_{CP}$ by means of the voltage level $V_{S2}$ on the second bias node S2 when the set of comparing signals ($V_{up}$, $V_{down}$) are high impedance.

In this example, the third semiconductor device 33 is an NMOS, whose drain and gate are electrically connected to the second voltage terminal $V_{GND}$ and the current output terminal $S_{CP}$, respectively. Therefore, the voltage drop $V_{GS-33}$ between the gate and source of the third semiconductor device 33 substantially equals to the voltage difference of the voltage level $V_{CP}$ at the current output node $S_{CP}$ and the voltage level $V_{GND}$ at the second voltage terminal.

On the other hand, the fourth semiconductor device 34 is a PMOS, whose source and gate are electrically connected to the first voltage terminal $V_{dd}$ and the drain of the third semiconductor device 33, respectively. The gate of the fourth semiconductor device 34 is electrically connected to its own drain. Besides, the gate of the fourth semiconductor device 34 and the gate of the first semiconductor device 2031b are electrically connected to the first bias node S1.

Likewise, according to FIG. 3A, the fifth semiconductor device 35 is a PMOS, whose source and gate are electrically connected to the first voltage terminal $V_{dd}$ and the current output node $S_{CP}$, respectively. Therefore, the voltage drop $V_{SG-35}$ between the gate and source of the fifth semiconductor device 33 substantially equals to the voltage difference of the voltage level $V_{dd}$ at the first voltage terminal and the voltage level $V_{CP}$ at the current output node $S_{CP}$.

The sixth semiconductor device 36 is an NMOS, whose source is electrically connected to the second voltage terminal $V_{GND}$. The drain of the fifth semiconductor device 35 is electrically connected to the drain of the sixth semiconductor device 36. The gate of the sixth semiconductor 36 is electrically connected to its own drain. Besides, the gate of the sixth semiconductor device 36 and the gate of the second semiconductor device 2032b are electrically connected to the second bias node S2.

According to the present invention, the first regulating unit 2033a is considered as a compensation current source to output the voltage level $V_{S1}$ on the first bias node S1 to the current output node $S_{CP}$ when the set of comparing signals ($V_{up}$, $V_{down}$) are high impedance. Therefore, the first current generator 2031a, whose source-drain voltage is fixed in theorem, in the constant current source (CCSO) 2031 is considered as an independent current source for providing a constant current.

The second regulating unit 2033b is considered as a compensation current source to output the voltage level $V_{S2}$ on the second bias node S2 to the current output node $S_{CP}$ when the set of comparing signals ($V_{up}$, $V_{down}$) are high impedance. Therefore, the second current generator 2032a, whose drain-source voltage is fixed in theorem, in the constant current sink (CCSI) 2032 is considered as an independent current sink for receiving the constant current. A constant current generated by the CCSO 2031 flows to the CCSI 2032 consistently.

In a case that the set of comparing signals ($V_{up}$, $V_{down}$) are high impedance, the current flows between the CCSO 2031 and the CCSI 2032 is kept constant. Since there is current constantly flowing to the current output node $S_{CP}$, the voltage level $V_{CP}$ at the current output node $S_{CP}$ is maintained at a certain value (with a scale of nano-ampere). Hence the constant current is feasible to bias the voltage level $V_{CP}$ at the current output node $S_{CP}$.

Therefore, when the set of comparing signals ($V_{up}$, $V_{down}$) are high impedance, the voltage regulator 2033 provides a first compensation voltage generated by the first compensated currents $I_{CP}$, that is the voltage level $V_{S1}$, on the first bias node S1 and a second compensation voltage generated by the second compensated currents $I_{NC}$, that is the voltage level $V_{S2}$, on the second bias node S2. Subsequently, the first current generator 2031a charges the downstream low pass filter with the first compensated current $I_{PC}$, and the second current generator 2032a discharges the low pass filter with a second compensated current $I_{NC}$.

Accordingly, the first and second currents $I_P$, $I_N$ are compensated. The current intensities of the first compensated current $I_{PC}$ and the second compensated current $I_{NC}$ are equal and the charging/discharging of the low pass filter can be balanced.

The voltage regulator 2033 is capable of providing a bias voltage at the current output node $S_{CP}$ by means of the first and second compensated currents $I_{PC}$, $I_{NC}$. Furthermore, the problem that the voltage level $V_{CP}$ at the current output node $S_{CP}$ is floating and accompanying disadvantages such as jitters can be solved.

As the intensities of the first and second compensated currents $I_{PC}$, $I_{NC}$, are substantially equal, these compensated currents do not affect the charging/discharging of the low pass filter even if the set of comparing signals ($V_{up}$, $V_{down}$) are high impedance.

The operations of the first regulating unit 2033a and the second regulating unit 2033b in response to the changes of the voltage level $V_{CP}$ at the current output node $S_{CP}$ are illustrated. The relationship between the first regulating unit 2033a and the first semiconductor device 2031b is first discussed, followed by discussions regarding the relationship between the second regulating unit 2033b and the second semiconductor device 2032b.

For the first regulating unit 2033a, when the set of comparing signals ($V_{up}$, $V_{down}$) are high impedance, the third semiconductor device 33 is regarded as a reference current source for providing a first compensated current $I_{PC}$ to the current output node $S_{CP}$.

The gate and drain of the fourth semiconductor device 34 are electrically connected to each other, and thus the voltage levels thereat are both equal to the voltage level at the first bias node S1. The formula $i_{DP}=k(v_{SG-P}-v_{t-P})^2(1+\lambda v_{SD-P})$ can be deduced to $i_{D-P}=k(v_{SG-P}-v_{t-P})^2(1+\lambda v_{SG-P})$, where $i_{DP}$ is a current flowing through the fourth semiconductor device 34, k and λ are constants, $v_{SG-P}$ is the voltage drop between the source and gate of the fourth semiconductor device 34, and $v_{t-P}$ is the threshold voltage of the fourth semiconductor device 34. That is, the voltage drop $V_{SG-34}$ of the source and gate of the fourth semiconductor device 34 is determined according to the first compensated current $I_{PC}$.

Moreover, as the gates of the fourth and first semiconductor devices 2031b, 34 are electrically connected to the first bias node S1, the voltage drop $V_{SG-34}$ is correlated to the voltage level $V_{G-2031b}$ at the gate of the first semiconductor device 2031b.

According to the equation $i_D=k(v_{GS}-v_t)^2(1+\lambda v_{DS})$, both the voltage drop $V_{GS}$ and $V_{DS}$ are in direct proportion to the current intensity. That is, since the voltage drops $V_{GS}$ and $V_{DS}$ change in opposite ways, e.g. the voltage drop $V_{GS}$ increases while the voltage drop $V_{DS}$ decreases, and vice versa, the intensity of the charging current flowing through the first semiconductor device 2031b can be kept stable.

In brief, a change of the voltage drop $V_{SG-2031b}$ between the source and gate of the first semiconductor device 2031b is used to compensate the change of the voltage drop $V_{SD-2031b}$ between the source and drain of the same. Therefore, the charging current generated and outputted by the first current generator 2031a is not affected by the changes of the voltage level $V_{CP}$ at the current output node $S_{CP}$.

For the second regulating unit 2033b, when the set of comparing signals ($V_{up}$, $Y_{down}$) are high impedance, the fifth semiconductor device 35 is regarded as a reference current source for providing a second compensated current $I_{NC}$ to the current output node $S_{CP}$.

As the gate and drain of the sixth semiconductor device 36 are electrically connected to each other, the voltage levels thereat are equal to the voltage level of the second bias node S2. The formula $i_{DN}=k(v_{GS-N}-v_{t-N})^2(1+\lambda v_{DS-N})$ can be deduced to $i_{DN}=k(v_{GS-N}-v_{t-N})^2(1+\lambda v_{GS-N})$, where $i_{DN}$ is a current flowing through the sixth semiconductor device 36, k and λ are constants, $v_{GS-N}$ is the voltage drop between the gate and source of the sixth semiconductor device 36, and $v_{t-N}$ is the threshold voltage of the sixth semiconductor device 34. That is, the voltage drop $V_{GS-36}$ of the gate and source of the sixth semiconductor device 36 is determined according to the second compensated current $I_{NC}$.

Moreover, as the gates of both the sixth and the second semiconductor device 36, 2032b are electrically connected to the second bias node S2, the voltage drop $V_{GS-36}$ correlates to the voltage level $V_{G-2032b}$ at the gate of the second semiconductor device 2032b.

According to the equation $i_D=k(v_{GS}-v_t)^2(1+\lambda v_{DS})$, both the voltage drops $V_{GS}$ and $V_{DS}$ are in direct proportion to the current intensity. That is, since the voltage drops $V_{GS}$ and $V_{DS}$ change in opposite ways, e.g. the voltage drop $V_{GS}$ increases while the voltage drop $V_{DS}$ decreases, and vice versa, the intensity of the charging current flows through the second semiconductor device 2032b can be kept stable.

In brief, a change of the voltage drop $V_{GS-2032b}$ between the gate and source of the second semiconductor device 2032b is used to compensate the change of the voltage drop $V_{DS-2032a}$ between the drain and source of the same. Therefore, the discharging current generated and outputted by the second current generator 2032a is not affected by the changes of the voltage level $V_{CP}$ at the current output node $S_{CP}$.

Meanwhile, the charge pump according to the present invention is capable of dynamically adjusting the voltage levels $V_{S1}$, $V_{S2}$ at the first and second bias nodes S1, S2 in response to the variation of the voltage level $V_{CP}$ at the current output node $S_{CP}$. That is, the voltage level $V_{S1}$ at the first bias node S1 is used to adjust the voltage drop $V_{SG-2031b}$ between the source and gate of the first semiconductor device 2031b. The voltage level $V_{S2}$ at the second bias node S2 is used to adjust the voltage drop $V_{GS-2032b}$ between the gate and source of the second semiconductor device 2032b.

Since the voltage drops $V_{GS-2031b}$, $V_{GS-2032b}$ are changed in response to the changes of the voltage level $V_{CP}$ at the current output node $S_{CP}$, the first current $I_P$ for charging and the second current $I_N$ for discharging become more stable as the first and second compensated currents $I_{PC}$, $I_{NC}$ are existed. In short, the voltage regulator 2033 exhibits a function of monitoring the variation of the voltage level $V_{CP}$ at the current output node $S_{CP}$, and providing a negative feedback for diminishing that variation.

In the example of FIG. 3A, in a case that the set of comparing signals ($V_{up}$, $V_{down}$) are high impedance, the voltage regulator adjusts the voltage levels at terminals of the semiconductor devices when the voltage level at the current output node increases. The operations of the first and second regulating units 2033a, 2033b are discussed below.

The internal operations of the first regulating unit 2033a are first discussed. When the voltage level $V_{CP}$ at the current output node $S_{CP}$ increases, the voltage drop $V_{GS-33}$ also increases. The increase of the voltage drop $V_{GS-33}$ causes the increase of the first compensated current $I_{PC}$ provided by the third semiconductor device 33.

The voltage drop $V_{SG-34}$ between the source and gate of the fourth semiconductor device 34 varies with the current intensity of the first compensated current $I_{PC}$. Therefore, the voltage drop $V_{SG-34}$ increases if the first compensated current $I_{PC}$ increases.

Since the source of the fourth semiconductor 34 is electrically connected to the first voltage terminal $V_{dd}$, the increase of the voltage drop $V_{SG}$ is equivalent to the decrease of voltage level at the gate of the fourth semiconductor device 34. Due to the connection of the gates of the first and fourth semiconductor devices 2031b, 34, the voltage level at the gate of the first semiconductor device 2031b also decreases. Meanwhile, the voltage drop $V_{SG-2031b}$ between the source and gate of the first semiconductor device 2031b increases.

To sum up, the increase of the voltage level $V_{CP}$ at the current output node $S_{CP}$ causes the decrease of the voltage drop $V_{SD-2031b}$ but the increase of the voltage drop $V_{SG-2031b}$.

Therefore, the voltage level at the conjunction of the first current generator 2031a and the first semiconductor device 2031b does not change with the increase of the voltage level $V_{CP}$ at the current output node $S_{CP}$. As a result, the current provided by the first current generator 2031a is kept stable.

As the first semiconductor device 2031b shares the same base with the fourth semiconductor device 34, threshold voltages $V_t$ of both the first and fourth semiconductor devices 2031b, 34 are equivalent. Besides, parameters related to material characteristics and operating temperatures of these two semiconductor devices 2031b, 34 are identical. Therefore, the first compensated current $I_{PC}$ conducted through the fourth semiconductor 34 is reflected to the first semiconductor device 2031b based on a current mirror structure.

Therefore, the relationship between changes of voltage levels discussed above can be explained from the viewpoint of current generation. That is, with the increasing of the voltage level $V_{CP}$ at the current output node $S_{CP}$, the first compensated current $I_{PC}$ increases. In such case, the corresponding reflected current to the first semiconductor device 2031b also increases. The decrease of the charging current caused by increasing of the voltage level $V_{CP}$ at the current output node $S_{CP}$ is hence being diminished by the increasing of the reflected current. Therefore, the charging current provided to the current output node $S_{CP}$ is stabilized.

The internal operations of the second regulating unit 2033b are then discussed. When the voltage level $V_{CP}$ at the current output node $S_{CP}$ increases, the voltage drop $V_{SG-35}$ decreases at meanwhile. The decrease of the voltage drop $V_{SG-35}$ implies that the second compensated current $I_{NC}$ provided by the fifth semiconductor device 35 decreases consequently.

The voltage drop $V_{GS-36}$ between the gate and the source of the sixth semiconductor device 34 is depending on the current intensity of the second compensated current $I_{NC}$. Therefore, the voltage drop $V_{GS-36}$ decreases if the second compensated current $I_{NC}$ decreases.

Since the source of the sixth semiconductor 36 is electrically connected to the second voltage terminal $V_{GND}$, the decrease of the voltage drop $V_{GS-36}$ is equivalent to the decrease of voltage level at the gate of the sixth semiconductor device 36. Due to the connection of the gates of the second and sixth semiconductor device 2032b, 36, the voltage level at the gate of the second semiconductor device 2032b also decreases. At the meanwhile, the voltage drop $V_{GS-2032b}$ between the source and the gate of the second semiconductor device 2031b decreases.

To sum up, the increase of the voltage level $V_{CP}$ at the current output node $S_{CP}$ implies the increase of the voltage drop $V_{DS-2032b}$ but the decrease of the voltage drop $V_{GS-2032b}$.

Therefore, the voltage level at the conjunction of the second current generator 2032a and the second semiconductor device 2032b does not change with the increase of the voltage level $V_{CP}$ at the current output node $S_{CP}$. Furthermore, the current provided by the second current generator 2032a is kept stable.

As the second semiconductor device 2032b shares the same base with the sixth semiconductor device 36, threshold voltages $V_t$ of both semiconductor devices 2032b, 36 are equivalent. Besides, parameters related to material characteristics and operating temperatures of these two semiconductor devices 2032b, 36 are identical. Therefore, the second compensated current $I_{NC}$ conducted through the sixth semiconductor 36 is reflected to the second semiconductor device 2032b based on a current mirror structure.

Therefore, the relationship between changes of voltage levels discussed above can be explained from the viewpoint of current generation. That is, with the increase of the voltage level $V_{CP}$, the second compensated current $I_{NC}$ decreases. In such a case, the corresponding reflected current to the second semiconductor device 2032b also decreases. The increase of the discharging current caused by the increase of the voltage level $V_{CP}$ at the current output node $S_{CP}$ is hence being diminished by the decrease of the reflected current. Therefore, the discharging current provided to the current output node $S_{CP}$ is stabilized.

Figure 3B:
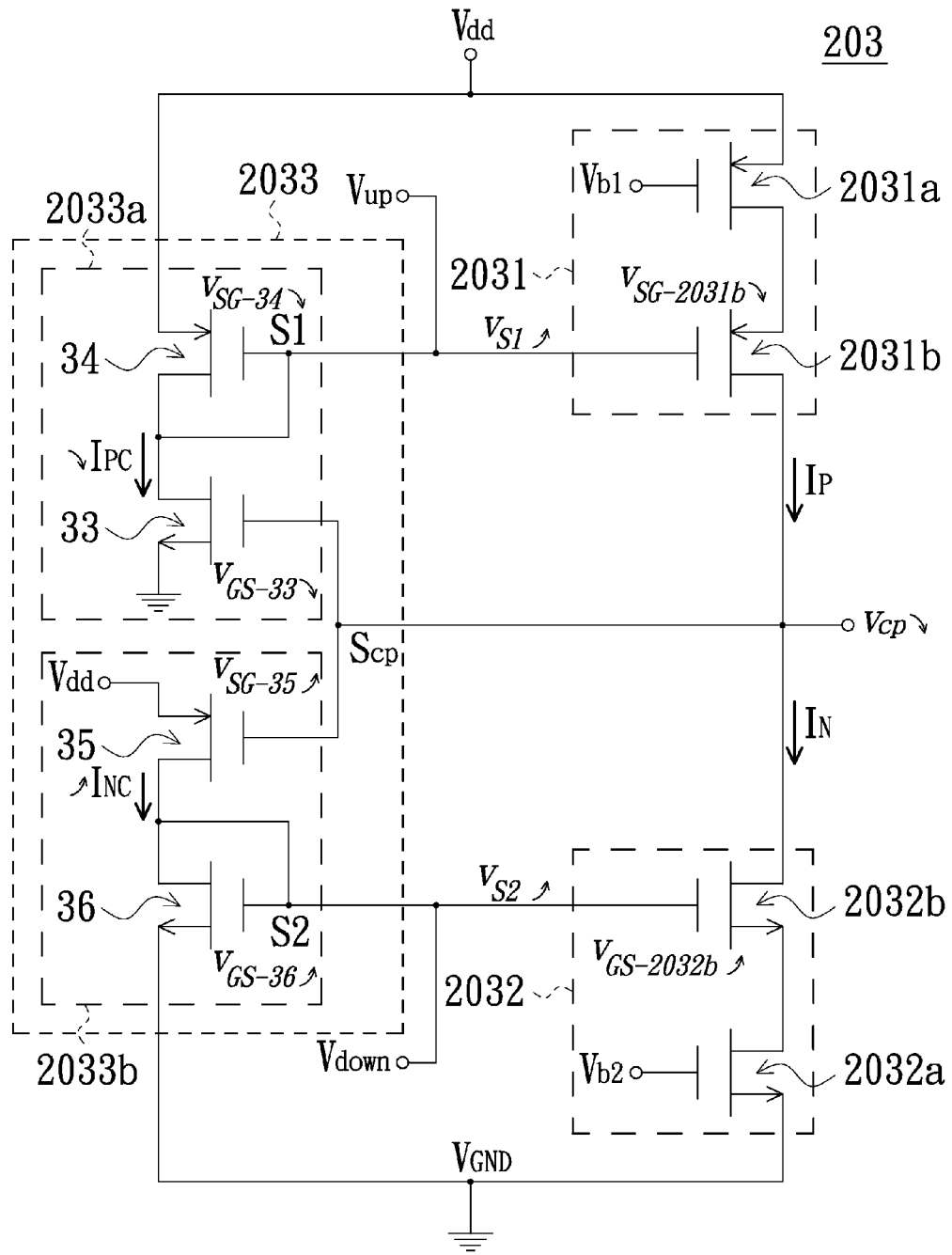
FIG. 3B is a schematic circuit diagram illustrating operations of an example of the charge pump as shown in FIG. 2 when the voltage level at the current output node decreases.

In the example of FIG. 3B, in a case that the set of comparing signals ($V_{up}$, $V_{down}$) are high impedance, the voltage regulator adjusts the voltage levels at terminals of the semiconductor devices when the voltage level at the current output node decreases. The operations of the first and second regulating units 2033a, 2033b are discussed below.

The internal operations of the first regulating unit 2033a are first discussed. When the voltage level $V_{CP}$ at the current output node $S_{CP}$ decreases, the voltage drop $V_{GS-33}$ also decreases. The decrease of the voltage drop $V_{GS-33}$ causes the decrease of the first compensated current $I_{PC}$ provided by the third semiconductor device 33.

The voltage drop $V_{SG-34}$ between the source and gate of the fourth semiconductor device 34 varies with the current intensity of the first compensated current $I_{PC}$. Therefore, the voltage drop $V_{SG-34}$ decreases if the first compensated current $I_{PC}$ decreases.

Since the source of the fourth semiconductor 34 is electrically connected to the first voltage terminal $V_{dd}$, the decrease of the voltage drop $V_{SG}$ is equivalent to the increase of voltage level at the gate of the fourth semiconductor device 34. Due to the connection of the gates of the first and fourth semiconductor device 2031b, 34, the voltage level at the gate of the first semiconductor device 2031b also increases. Meanwhile, the voltage drop $V_{SG-2031b}$ between the source and gate of the first semiconductor device 2031b decreases.

To sum up, the decrease of the voltage level $V_{CP}$ at the current output node $S_{CP}$ causes the increase of the voltage drop $V_{SD-2031b}$ but the decrease of the voltage drop $V_{SG-2031b}$.

Therefore, the voltage level at the conjunction of the first current generator 2031a and the first semiconductor device 2031b does not change with the decrease of the voltage level $V_{CP}$ at the current output node $S_{CP}$. As a result, the current provided by the first current generator 2031a is kept stable.

As the first semiconductor device 2031b shares the same base with the fourth semiconductor device 34, threshold voltages Vt of both semiconductor devices 2031b, 34 are equivalent. Besides, parameters related to material characteristics and operating temperatures of these two semiconductor device 2031b, 34 are identical. Therefore, the first compensated current $I_{PC}$ conducted through the fourth semiconductor 34 is reflected to the first semiconductor device 2031b based on the current mirror structure.

Therefore, the relationship between changes of voltage levels discussed above can be explained from the viewpoint of current generation. That is, with the decrease of the voltage level $V_{CP}$, the first compensated current $I_{PC}$ decreases. In such case, the corresponding reflected current to the first semiconductor device 2031b also decreases. The increase of the charging current caused by the decrease of the voltage level $V_{CP}$ at the current output node $S_{CP}$ is hence being diminished by the decrease of the reflected current. Therefore, the charging current provided to the current output node $S_{CP}$ is stabilized.

The internal operations of the second regulating unit 2033b are then discussed. When the voltage level $V_{CP}$ at the current output node $S_{CP}$ decreases, the voltage drop $V_{SG-35}$ increases at meanwhile. The increase of the voltage drop $V_{SG-35}$ implies that the second compensated current $I_{NC}$ provided by the fifth semiconductor device 35 increases consequently.

The voltage drop $V_{GS-36}$ between the gate and the source of the sixth semiconductor device 34 is depending on the current intensity of the second compensated current $I_{NC}$. Therefore, the voltage drop $V_{GS-36}$ increases if the second compensated current $I_{NC}$ increases.

Since the source of the sixth semiconductor 36 is electrically connected to the second voltage terminal $V_{GND}$, the increase of the voltage drop $V_{GS-36}$ is equivalent to the increase of voltage level at the gate of the sixth semiconductor device 36. Due to the connection of the gates of the second and the sixth semiconductor devices 2032b, 36, the voltage level at the gate of the second semiconductor device 2032b also increases. At the meanwhile, the voltage drop $V_{GS-2032b}$ between the source and the gate of the second semiconductor device 2031b increases.

To sum up, the decrease of the voltage level $V_{CP}$ at the current output node $S_{CP}$ implies the decrease of the voltage drop $V_{DS-2032b}$ but the increase of the voltage drop $V_{GS-2032b}$.

Therefore, the voltage level at the conjunction of the second current generator 2032a and the second semiconductor device 2032b does not change with the decrease of the voltage level $V_{CP}$ at the current output node $S_{CP}$. Furthermore, the current provided by the second current generator 2032a is kept stable.

As the second semiconductor device 2032b shares the same base with the sixth semiconductor device 36, threshold voltages $V_t$ of both semiconductor device 2032b, 36 are equivalent. Besides, parameters related to material characteristics and operating temperatures of these two semiconductor device 2032b, 36 are identical. Therefore, the second compensated current $I_{NC}$ conducted through the sixth semiconductor 36 is reflected to the second semiconductor device 2032b based on a current mirror structure.

Therefore, the relationship between changes of voltage levels discussed above can be explained from the viewpoint of current generation. That is, with the decrease of the voltage level $V_{CP}$, the second compensated current $I_{NC}$ increases. In such case, the corresponding reflected current to the second semiconductor device 2032b also increases. The decrease of the discharging current caused by the decrease of the voltage level $V_{CP}$ at the current output node $S_{CP}$ is hence being diminished by the increase of the reflected current. Therefore, the discharging current provided to the current output node $S_{CP}$ is stabilized.

Figure 4:
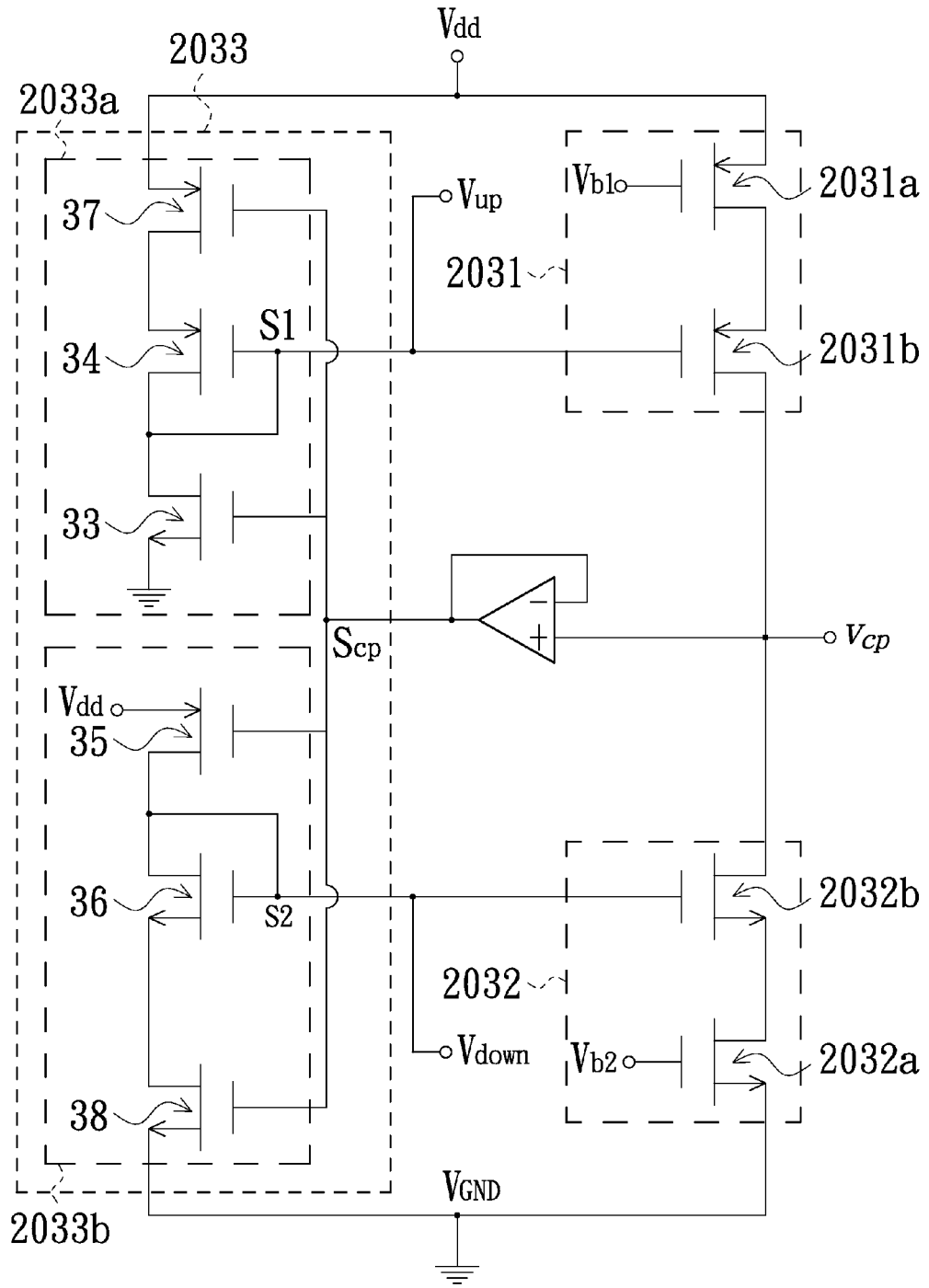
FIG. 4 is a schematic circuit diagram illustrating another example of the charge pump as shown in FIG. 2.

FIG. 4 is a schematic circuit diagram illustrating another example of the charge pump as shown in FIG. 2. According to FIG. 4, it is shown that extra components can be optionally used in the charge pump under a variety of considerations such as circuit matching.

While considering the voltage matching issue between the first and the fourth semiconductor device 2031b, 34, a seventh semiconductor device 37 is placed between the fourth semiconductor device 34 and the first voltage terminal $V_{dd}$. The gates of the first and fourth semiconductor devices 2031b, 34 are electrically connected to each other, but the first current generator 2031a is in between the first semiconductor device 2031b and the first voltage terminal $V_{dd}$ while the fourth semiconductor device 34 is electrically connected to the first voltage terminal $V_{dd}$ directly. Therefore, the seventh semiconductor device 37 is utilized to make the voltage levels at the gates of the fourth and the first semiconductor 34, 2031b switches match.

Similarly, an eighth semiconductor device 38 may be optionally used in between the sixth semiconductor device 36 and the second voltage terminal $V_{GND}$, for compensating the voltage level at the gate of the second semiconductor device 203b.

Moreover, a unit gain buffer (also referred to as a buffer amplifier) 2034 is optionally used in between the first semiconductor device 2031b, the second semiconductor device 2032b, and the voltage regulator 203. The unit gain buffer 2034 is an amplifier whose output end is electrically connected to its negative input end. The unit gain buffer 2034 passes the voltage level of the voltage signal VCP at the current output node SCP to the voltage regulator. Since the unit gain buffer 2034 has features of high input resistance, low output resistance etc., signal decay of the voltage regulator 203 is minimized.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A charge pump, comprising:
   a first current generator electrically connected to a first voltage terminal, and providing a first current;
   a first semiconductor device electrically connected to the first current generator and a current output node, and optionally conducting flow of the first current to the current output node;
   a second current generator electrically connected to a second voltage terminal and providing a second current;
   a second semiconductor device electrically connected to the second current generator and the current output node, and optionally conducting flow of the second current to the current output node; and
   a voltage regulator electrically connected to the first and second semiconductor devices and the current output node for dynamically adjusting a voltage level at the gate of the first or second semiconductor devices so as to adjust the first current or the second current outputted to the current output node.

2. The charge pump according to claim 1, wherein the voltage regulator raises the voltage level at the gate of the first semiconductor device when the voltage level at the current output node increases.

3. The charge pump according to claim 1, wherein the voltage regulator lowers the voltage level at the gate of the first semiconductor device when the voltage level at the current output node decreases.

4. The charge pump according to claim 1, wherein the voltage regulator lowers the voltage level at the gate of the second semiconductor device when the voltage level at the current output node increases.

5. The charge pump according to claim 1, wherein the voltage regulator raises the voltage level at the gate of the second semiconductor device when the voltage level at the current output node decreases.

6. The charge pump according to claim 1, wherein the voltage regulator comprises:
   a first regulating unit electrically connected to the first voltage terminal, the current output node and the first semiconductor device for adjusting the voltage level at the gate of the first semiconductor device according to a change of the voltage level at the current output node; and
   a second regulating unit electrically connected to the second voltage terminal, the current output node, and the second semiconductor device for adjusting the voltage level at the gate of the second semiconductor device according to the change of the voltage level at the current output node.

7. The charge pump according to claim 6, further comprising:
   a unit gain amplifier electrically connected to the current output node and the first and second regulating units for reflecting the voltage level at the current output node to the regulating units.

8. The charge pump according to claim 1, wherein the first semiconductor device is turned on in response to a specified state of a first comparing signal received from a phase/frequency detector disposed upstream of the charge pump, and the second semiconductor device is turned on in response to a specified state of a second comparing signal received from the phase/frequency detector.

9. The charge pump according to claim 1, wherein the first voltage terminal is coupled to a voltage source, and the second voltage terminal is coupled to ground.

10. The charge pump according to claim 1, wherein the voltage regulator electrically connected to gate electrodes of the first and second semiconductor devices, and the current output node.

11. A charge pump, comprising:
   a first current generator for providing a first current to a current output node;
   a first semiconductor device electrically connected to the first current generator and the current output node, and turned on in response to a specified state of a first signal inputted thereto so as to conduct flow of the first current to the current output node;
   a second current generator for providing a second current;
   a second semiconductor device electrically connected to the second current generator and the current output node, and turned on in response to a specified state of a second signal inputted thereto so as to conduct flow of the second current to the current output node; and
   a voltage regulator electrically connected to the first and second semiconductor devices and the current output node, and configured to provide a bias voltage at the current output node when both the first and second signals are high impedance.

12. The charge pump according to claim 11, wherein the voltage regulator comprises:
   a first regulating unit electrically connected to a first voltage terminal, where the first regulating unit is electrically connected to the current output node and the first semiconductor device, for outputting a first compensated current to the current output node; and
   a second regulating unit electrically connected to a second voltage terminal, where the second regulating unit is electrically connected to the current output node, and the second semiconductor device, for outputting a second compensated current to the current output node,
   wherein the bias voltage is generated at the current output node in response to the first and second compensated currents.

13. The charge pump according to claim 12, wherein the first voltage terminal is coupled to a voltage source, and the second voltage terminal is coupled to ground.

14. The charge pump according to claim 11, wherein the first and second regulating units are electrically connected to a filter disposed downstream of the charge pump for charging/discharge the filter with the first and second compensated currents, and intensities of the first and second compensated currents are substantially equal to each other.

15. The charge pump according to claim 11, further comprising
   a unit gain amplifier electrically connected to the current output node and the first and second regulating units for reflecting the voltage level at the current output node to the regulating units.

16. The charge pump according to claim 11, wherein the first signal and the second signal are a first comparing signal and a second comparing signal, which are received from a phase/frequency detector disposed upstream of the charge pump.

17. The charge pump according to claim 11, wherein the voltage regulator electrically connected to gate electrodes of the first and second semiconductor devices, and the current output node.

* * * * *